(12) United States Patent
Sinsky et al.

(10) Patent No.: US 9,369,317 B2
(45) Date of Patent: Jun. 14, 2016

(54) CIRCUITRY AND METHOD FOR MULTI-LEVEL SIGNALS

(71) Applicants: IMEC VZW, Leuven (BE); Universiteit Gent, Gent (BE)

(72) Inventors: Jeffrey Sinsky, Malboro, NJ (US); Geert de Peuter, Keerbergen (BE); Guy Torfs, Gent (BE); Zhisheng Li, Wilrijk (BE); Timothy De Keulenaer, Gent (BE)

(73) Assignees: IMEC VZW, Leuven (BE); Universiteit Gent, Gent (BE)

( * ) Notice: Subject to any disclaimer, the term of this patent is extended or adjusted under 35 U.S.C. 154(b) by 0 days.

(21) Appl. No.: 14/634,176

(22) Filed: Feb. 27, 2015

(65) Prior Publication Data

US 2015/0244547 A1 Aug. 27, 2015

(30) Foreign Application Priority Data

Feb. 27, 2014 (EP) .................................... 14305284

(51) Int. Cl.
| | |
|---|---|
| *H03M 1/12* | (2006.01) |
| *H03M 1/36* | (2006.01) |
| *H04B 10/60* | (2013.01) |
| *H04L 25/49* | (2006.01) |

(52) U.S. Cl.
CPC ......... *H04L 25/4917* (2013.01); *H03M 1/1215* (2013.01); *H04B 10/60* (2013.01); *H03M 1/361* (2013.01)

(58) Field of Classification Search
CPC .... H04B 10/60; H04M 1/361; H04M 1/1215; H04L 25/4917
USPC ......................................................... 398/202
See application file for complete search history.

(56) References Cited

U.S. PATENT DOCUMENTS

| | | | | |
|---|---|---|---|---|
| 5,555,276 | A * | 9/1996 | Koenck ................... | B60R 11/02 332/100 |
| 7,505,541 | B1 | 3/2009 | Brunn et al. | |
| 2002/0196510 | A1* | 12/2002 | Hietala ................... | H04L 1/004 398/202 |
| 2006/0274850 | A1* | 12/2006 | Kasai ....................... | H04L 5/14 375/286 |

FOREIGN PATENT DOCUMENTS

EP 1 503 501 A1 2/2005

OTHER PUBLICATIONS

European Search Report, European Patent Application No. 14305284.3, dated Aug. 27, 2014.

* cited by examiner

*Primary Examiner* — Dalzid Singh
(74) *Attorney, Agent, or Firm* — McDonnell Boehnen Hulbert & Berghoff LLP (57) ABSTRACT

Circuitry for converting a multi-level signal into at least one binary signal, having a period T and comprising n signal levels, includes comparing and splitting circuitry configured for comparing a value of the multi-level signal with (n−1) different reference values, and having N sets of (n−1) output terminals for outputting N sets of (n−1) output signals indicating whether the value of the multi-level signal is below or above the (n−1) reference values. The circuitry also includes N sets of (n−1) sample-and-hold circuits having an input and an output and being configured for operating at a clock period N*T, wherein each output terminal is connected to the input of a sample-and-hold circuit. Further, the circuitry includes logical circuitry connected to the outputs of the N sets of (n−1) sample-and-hold circuits for generating at least one binary signal having a period N*T.

15 Claims, 5 Drawing Sheets

FIG. 6

CIRCUITRY AND METHOD FOR MULTI-LEVEL SIGNALS

CROSS-REFERENCE TO RELATED APPLICATION

This application claims priority to European Patent Application No. 14305284.3 filed on Feb. 27, 2014, the contents of which are hereby incorporated by reference.

FIELD OF THE DISCLOSURE

This disclosure relates to circuitry, such as receiver circuitry, for converting a multi-level signal into at least one binary signal, as well as to methods for converting a multi-level signal into at least one binary signal.

BACKGROUND

Duobinary modulation is an interesting scheme for high data rate communication as it can use a channel's limited bandwidth advantageously to shape the signal thus requiring less equalization compared to NRZ modulation. However, designers face speed limitation problems in high-speed receivers for duobinary signals.

The reception of duobinary modulation involves decoding bit values from a received multilevel signal. This may be realized by an analog to digital converter (ADC) which directly decodes the signal level into bit values. However, circuit implementations of a high-speed ADC are characterized by high power consumption and limited analog bandwidth, making them unsuitable for interconnects operating in range of multi-ten-Gbps.

Another proposed solution is a receiver comprising a wideband amplifier followed by a wideband signal splitter. Two copies of a X Gbps signal are compared with threshold voltages corresponding to upper and lower eye levels. Subsequently a D-type flip-flop is used to hold signal values when triggered by a clock signal and values are compared in an XOR circuit. The result of the logical operation is the decoded NRZ data stream which is further processed to demultiplexed low speed (X/2 Gbps) data streams. The problem of this implementation is that the receiver chain operates at the rate corresponding to the symbol rate of the incoming signal (X Gbps). This puts a stringent limitation on the XOR logic gate settling time and effectively limits the maximum achievable symbol rate of the receiver.

SUMMARY

The present disclosure helps to address these problems, and provides circuitry that can deal with multi-level signals having a high frequency.

According to a first aspect of the disclosure there is provided circuitry for converting a multi-level signal into at least one binary signal, the multi-level signal having a time period T and comprising n signal levels, n being equal to or greater than 3. The circuitry comprises comparing and splitting circuitry, sample-and-hold circuitry, and logic circuitry. The comparing and splitting circuitry is configured for comparing a value of the multi-level signal with (n−1) different reference values, and has N sets of (n−1) output terminals for outputting N sets of (n−1) output signals, each set of (n−1) output signals indicating whether the value of the multi-level signal is below or above the (n−1) reference values, wherein N is greater than or equal to 2. The sample-and-hold circuitry comprises N sets of (n−1) sample-and-hold circuits having an input and an output and being configured for operating at a clock period N*T. Each set of the N sets is arranged for sampling-and-holding at moments in time which are shifted in time with respect to another set of the N sets. Each output terminal of a set of the N sets of (n−1) output terminals is connected to the input of a sample-and-hold circuit of a corresponding set of the N sets of (n−1) sample-and-hold circuits. The logical circuitry is connected to the outputs of the N sets of (n−1) sample-and-hold circuits and is configured for generating at least one binary signal having a period N*T using the signals on the outputs of the N sets of (n−1) sample-and-hold circuits.

Embodiments of the disclosure are based inter alia on the insight that by cleverly designing the circuitry the bandwidth requirements of many of the circuitry components can operate at a lower rate than the rate of the received multi-level signal. In reality, often the multi-level signal is a result of multiplexing data at a transmitter side, whereby processing of the data at the receiving side with lower bandwidth components can be advantageous. In embodiments of the disclosure, the sample-and-hold circuitry and the logic circuitry can operate at a lower frequency due to the provision of the splitting and comparing circuitry.

According to an example embodiment, each set of the N sets of (n−1) sample-and-hold circuits is arranged for sampling-and-holding at moments in time which are shifted over the period T with respect to another set of the N sets. In that way the multilevel signal can be accurately sampled. According to one embodiment, the logic circuitry is configured for generating N binary signals.

According to an example embodiment, the comparing and splitting circuitry comprises at least one first splitter for splitting the multi-level signal in (n−1) multilevel signals; (n−1) comparators, each comparator having an input connected for receiving a multi-level signal of the (n−1) multilevel signals, and an output; each comparator being configured with a different reference value of the (n−1) reference values; and at least (n−1) second splitters; wherein the output of each comparator is connected through at least one second splitter of the at least (n−1) second splitters to a sample-and-hold circuit of each set of the N sets of (n−1) sample-and-hold circuits.

According to an example embodiment, n is 3 so that the multilevel signal is a duobinary signal, and N is 4, and the comparing and splitting circuitry comprises: at least one first splitter for splitting the duobinary signal in two duobinary signals; two comparators, each comparator having an input connected for receiving a duobinary signal of the two duobinary signals, and an output; each comparator being configured with a different reference value of the (n−1) reference values; two second splitters; and four third splitters; wherein the output of each comparator is connected through a second splitter of the two second splitters and a third splitter of the four third splitters to a sample-and-hold circuit of each set of the four sets of two sample-and-hold circuits.

According to one embodiment, the logical circuitry comprises at least N XOR circuits. Typically a first XOR circuit of the at least N XOR circuits has a first input connected to the output of a first sample-and-hold circuit of a first set of the N sets of (n−1) sample-and-hold circuits and a second input connected to a second different sample-and-hold circuit of the first set; and a second XOR circuit of the at least N XOR circuits has a first input connected to the output of a first sample-and-hold circuit of a second set of the N sets of (n−1) sample-and-hold circuits and a second input connected to a second different sample-and-hold circuit of the second set.

In an example embodiment, the logical circuitry comprises N*(n−2) XOR circuits. Each XOR circuit of the N*(n−2) XOR circuits may then have a first input connected to the output of a first sample-and-hold circuit of a first set of the N sets of (n−1) sample-and-hold circuits and a second input connected to a second different sample-and-hold circuit of the first set.

According to one embodiment, the circuitry further comprises receiver circuitry for receiving a signal and an amplifier for amplifying the received signal, the amplified received signal forming the multi-level signal. The receiver circuitry may be configured for receiving an optical signal and for converting the optical signal into the multi-level signal.

In another embodiment, the N sets of (n−1) sample-and-hold circuits are N sets of (n−1) flip-flop circuits.

According to another aspect of the disclosure, there is provided a method for converting a multi-level signal into at least one binary signal, the multi-level signal having a period T and comprising n signal levels, n being equal to or greater than 3. The method includes comparing a value of the multi-level signal with (n−1) different reference values, and outputting N sets of (n−1) output signals, each set of (n−1) output signals indicating whether the value of the multi-level signal is below or above the (n−1) reference values, wherein N is greater than or equal to 2. The method also includes operating N sets of (n−1) sample-and-hold circuits at a clock period N*T, each set of the N sets sampling-and-holding at moments in time which are shifted with respect to another set of the N sets; wherein each set of (n−1) output signals of the N sets of (n−1) output signals is sent to a corresponding set of the N sets of (n−1) sample-and-hold circuits. Further, this example method includes generating at least one binary signal having a period N*T using the signals output by the N sets of (n−1) sample-and-hold circuits.

According to an example embodiment, each set of the N sets of (n−1) sample-and-hold circuits is sampling-and-holding at moments in time which are shifted over the time period T with respect to another set of the N sets.

According to one embodiment, the comparing a value of the multi-level signal with (n−1) different reference values and the outputting N sets of (n−1) output signals comprises: splitting the multi-level signal in (n−1) multilevel signals; comparing the (n−1) multilevel signals with the (n−1) reference values and outputting (n−1) comparator output signals; and splitting the comparator output signals so that N sets of (n−1) comparator output signals are obtained.

According to an example embodiment, the method further comprises receiving a signal and amplifying the received signal, the amplified received signal forming the multi-level signal. According to a possible embodiment the method may comprise receiving an optical signal and converting the received optical signal into the multi-level signal.

According to yet another aspect of the disclosure, there is provided circuitry for performing the method of any one of the embodiments disclosed herein.

BRIEF DESCRIPTION OF THE FIGURES

The accompanying drawings are used to illustrate presently preferred non-limiting example embodiments of devices and methods of the present disclosure. The above and other advantages of the features and objects of the disclosure will become more apparent and the disclosure will be better understood from the following detailed description when read in conjunction with the accompanying drawings, in which.

DESCRIPTION OF EMBODIMENTS

Figure 1:
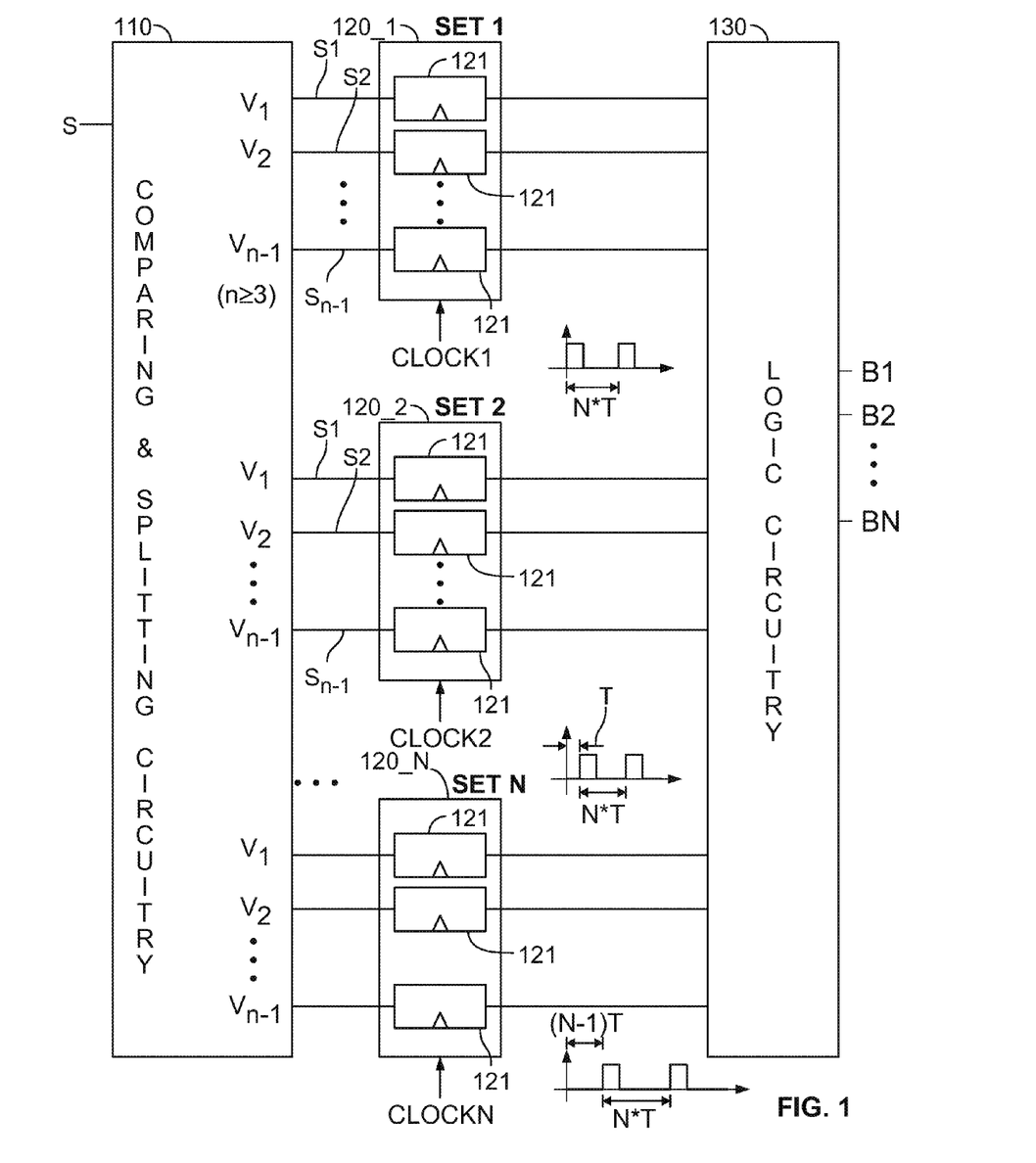
FIG. 1 is a schematic diagram of an example embodiment of circuitry of the disclosure.

FIG. 1 illustrates a general example embodiment of circuitry for converting a multi-level signal into at least one binary signal. It is assumed that the multi-level signal has a period T and that it comprises n signal levels, n being equal to or greater than 3. The circuitry comprises comparing and splitting circuitry 110, N sets of (n−1) sample-and-hold circuits 120_1, 120_2, ... 120_N, and logic or logical circuitry 130. In one example, N is greater than or equal to 2. In the illustrated embodiment of FIG. 1, it may appear as if N is greater than 2, but the skilled person would understand that there may be only two sets 120_1, 120_2 of sample-and-hold circuits if N=2.

The comparing and splitting circuitry 110 is configured for comparing a value of the multi-level signal with (n−1) different reference values $V_1, V_2, \ldots V_{n-1}$, and has N sets of (n−1) output terminals for outputting N sets of (n−1) output signals S1, S2, ... Sn−1. Each output signal S1, S2, ... Sn−1 indicates whether the value of the multi-level signal S is below or above a respective reference value $V_1, V_2, \ldots V_{n-1}$, respectively. For instance, S1 indicates whether the signal S is below or above $V_1$, S2 indicates whether the signal S is below or above $V_2$, and so on. In one example embodiment, the comparing and splitting circuitry 110 comprises a plurality of splitters and a plurality of comparators.

The N sets 120_1, 120_2, ... 120_N of (n−1) sample-and-hold circuits 121 are configured for operating at a clock period N*T. Each set of the N sets is arranged for sampling-and-holding at moments in time which are shifted over a time period T with respect to another set of the N sets. In the illustrated embodiment set 120_2 is provided with a clock which is shifted over a period T with respect to the clock of set 120_1, and set 120_N is provided with a clock which is shifted over a period (N−1)*T with respect to the clock of set 120_1. Although not illustrated, the skilled person would understand that there may be provided additional circuitry for generating the clock signals CLOCK 1, CLOCK 2, ... CLOCK N. Each output terminal of the comparing and splitting circuitry 110 is connected to the input of a sample-and-hold circuit of a corresponding set 120_1, 120_2, ... 120_N.

The logical circuitry 130 is connected to the outputs of the N*(n−1) sample-and-hold circuits 121 for generating at least one binary signal using the signals S1, S2, ... Sn−1 on the outputs of the N sets of (n−1) sample-and-hold circuits 121. In one embodiment, the logical circuitry 130 is configured to generate N binary signals B1, B2, ... BN, such as by using XOR circuits, for example. In that way the data in the multi-level signal S with frequency 1/T is converted into N binary signals B1, B2, ..., BN with a frequency 1/(N*T).

The present embodiment helps to reduce the required bandwidth of the circuitry components which pose the bottleneck of the reception chain. In one example, this is achieved by:

splitting and comparing the multilevel signal;
holding the signal value in intervals of N symbols for each path and with interleave of a symbol period T between the paths;

performing the logical operations on the corresponding interleaved signal levels from the differential limiter paths at a symbol rate which is a factor 1/N lower than the symbol rate of the multilevel signal; and providing an output of N NRZ signals B1, ... BN at a symbol rate which is a factor 1/N lower than the symbol rate of the multilevel signal.

Figure 2:
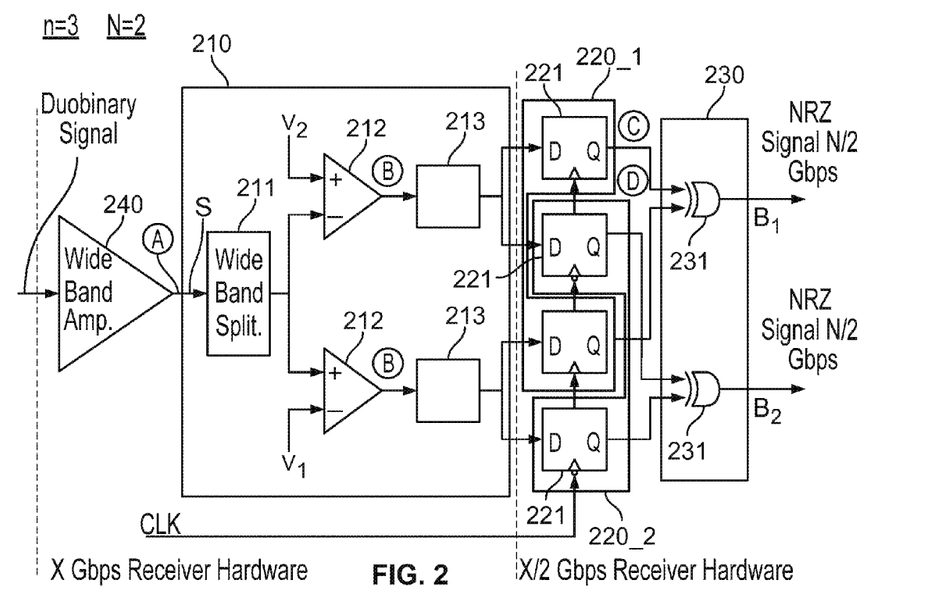
FIG. 2 is a schematic diagram of an example embodiment of circuitry of the disclosure where n=3 and N=2.

FIG. 2 illustrates an example embodiment for which n=3 and N=2, such that the multi-level signal is a duobinary signal. The circuitry comprises an amplifier 240 for amplifying a received duobinary signal in order to obtain a duobinary signal S; comparing and splitting circuitry 210; two sets 220_1, 220_2 of two flip-flop circuits 221 each; and logic or logical circuitry 230.

The comparing and splitting circuitry 210 comprises a first splitter 211 for splitting the duobinary signal S in two multilevel signals, two comparators 212, and two second splitters 213. Each comparator 212 has an input connected for receiving a duobinary signal of the two duobinary signals, and an output. A first comparator 212 is configured for comparing the signal S with a first reference value $V_1$, and a second comparator 212 is configured for comparing the signal S with a second reference value $V_2$. The output of each comparator 212 is connected to a second splitter 213 for splitting the output signal into a first and a second output signal which are sent to flip-flop circuits 221 of a first set 220_1, and flip-flop circuits 221 of a second set 220_2, respectively. The first set 220_1 of flip-flop circuits 221 is arranged for sampling and holding in accordance with a rising edge of clock signal CLK, and the second set 220_2 of flip-flop circuits 221 is arranged for sampling and holding in accordance with a falling edge of the clock signal CLK.

The logical circuitry 230 comprises two XOR circuits 231. A first XOR circuit 231 has a first input connected to the output of a first flip-flop circuit 221 of a first set 220_1, and a second input connected to a second different flip-flop circuit 221 of the first set 220_1. A second XOR circuit 231 has a first input connected to the output of a first flip-flop circuit 221 of a second set 220_2, and a second input connected to a second different flip-flop circuit 221 of the second set 220_2. The logical circuitry 230 is configured to generate two binary signals B1, B2. In that way the data in the duobinary signal S with frequency 1/T is converted into two binary signals B1, B2 with a frequency 1/(2*T).

Figure 3:
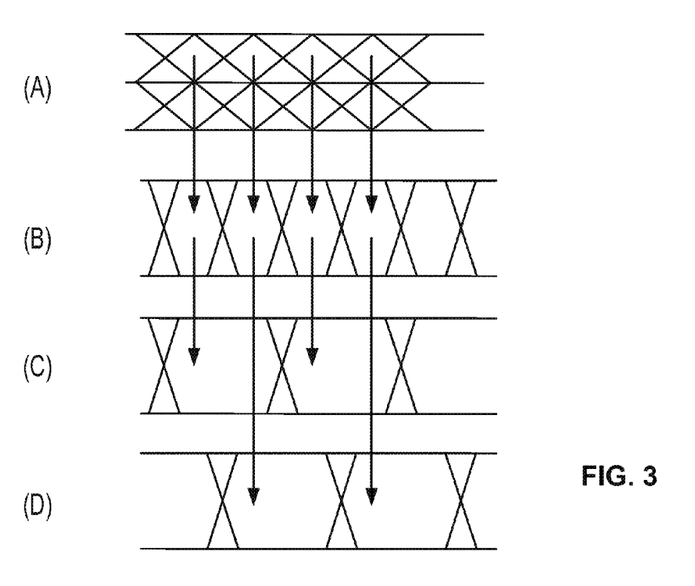
FIG. 3 illustrates signals at different points in the circuitry of FIG. 2.

FIG. 3 illustrates schematically the waveforms at different points in the circuitry of FIG. 2. The waveform at the output of the amplifier 240 is represented by (A) in FIGS. 2 and 3. Two copies of this signal are compared with threshold voltages $V_1$, $V_2$, resulting in waveform (B). The elements up to this point may require a bandwidth necessary to support signal at rate of X Gbps. Subsequently each of the comparators 212 is followed by a broadband splitter 213, resulting in two copies of signals after each comparator 212. The copies are sampled-and-held alternatively by a D-type flip-flop 221 on the rising and falling edge of the clock operated at a frequency X/2 (=1/(2*T)). Effectively in each branch the signal is demultiplexed to a rate of X/2 as illustrated in FIG. 3 by waveforms (C) and (D). Subsequently the XOR operation can be performed on the demultiplexed components for each of the interleaved bits separately, using an XOR gate 231 operating at an X/2 Gbps rate.

Figure 4:
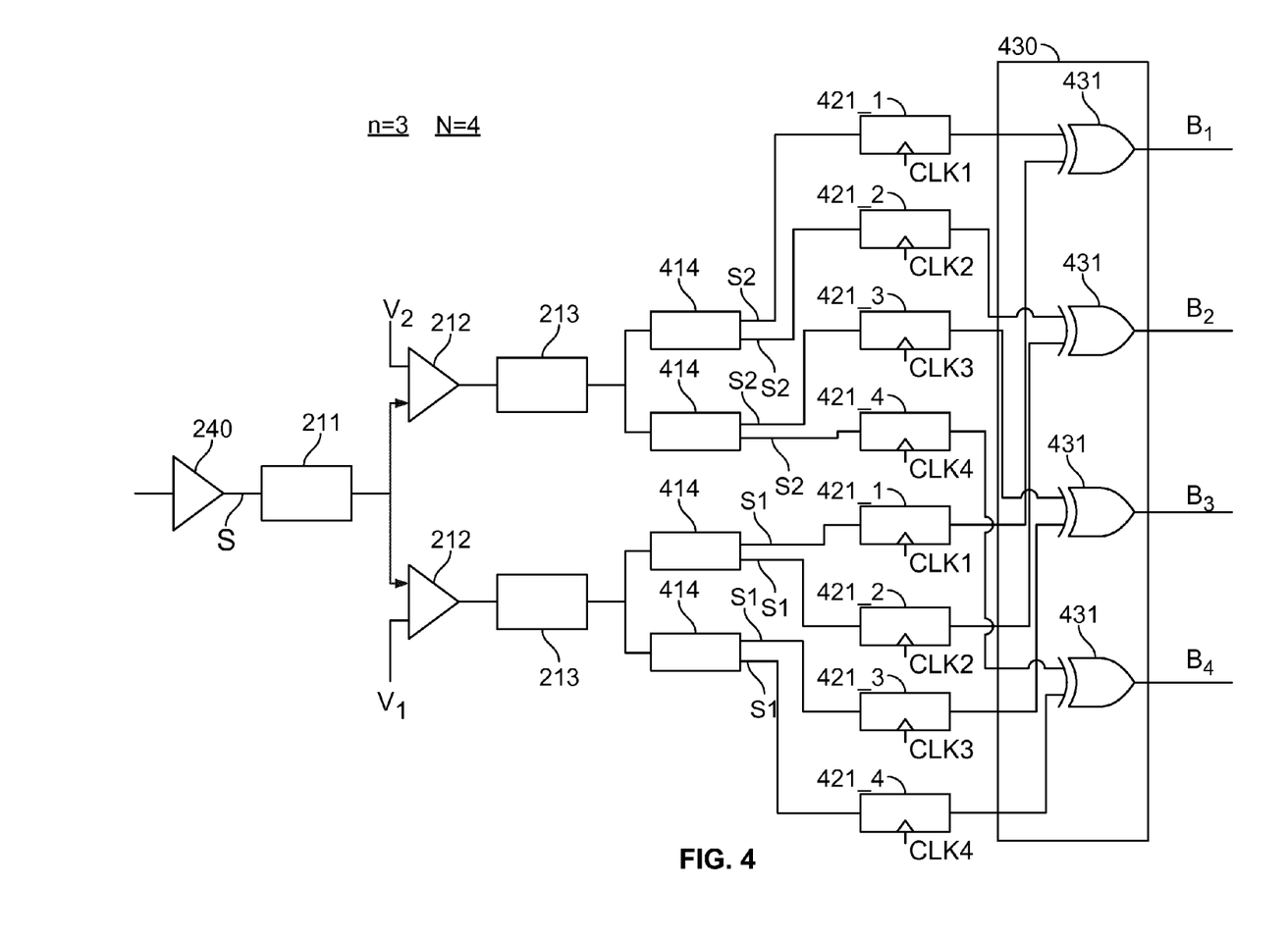
FIG. 4 is a schematic diagram of an example embodiment of circuitry of the disclosure where n=3 and N=4.

FIG. 4 illustrates an example embodiment for which n=3 and N=4, such that the multi-level signal is a duobinary signal and the frequency is reduced by a factor 4. The circuitry comprises an amplifier 240, a first splitter 211, two comparators 212, two second splitters 213, two third splitters 414, four sets of two flip-flop circuits each 421_1, 421_2, 421_3, 421_4, and logic circuitry 430 with four XOR circuits 431. The amplifier 240, first splitter 211, two comparators 212, and two second splitters 213 may be identical to the ones described in connection with FIG. 2. The additional splitters 414 have been added in order to obtain four sets of two output signals S1, S2. Each set of two flip-flop circuits 421_1, 421_2, 421_3, 421_4 is provided with a respective clock CLK1, CLK2, CLK3, CLK4. As in the embodiment of FIG. 1 the clock signals CLK1, CLK2, CLK3, CLK4 may be shifted over a period T with respect to each other. The circuitry is largely similar to the circuitry of FIG. 2 with the difference that the additional splitters 414 are provided and that eight instead of four flip-flop circuits are used so that binary signals B1, B2, B3, B4 with a frequency 1/(4T) can be obtained.

Figure 5:
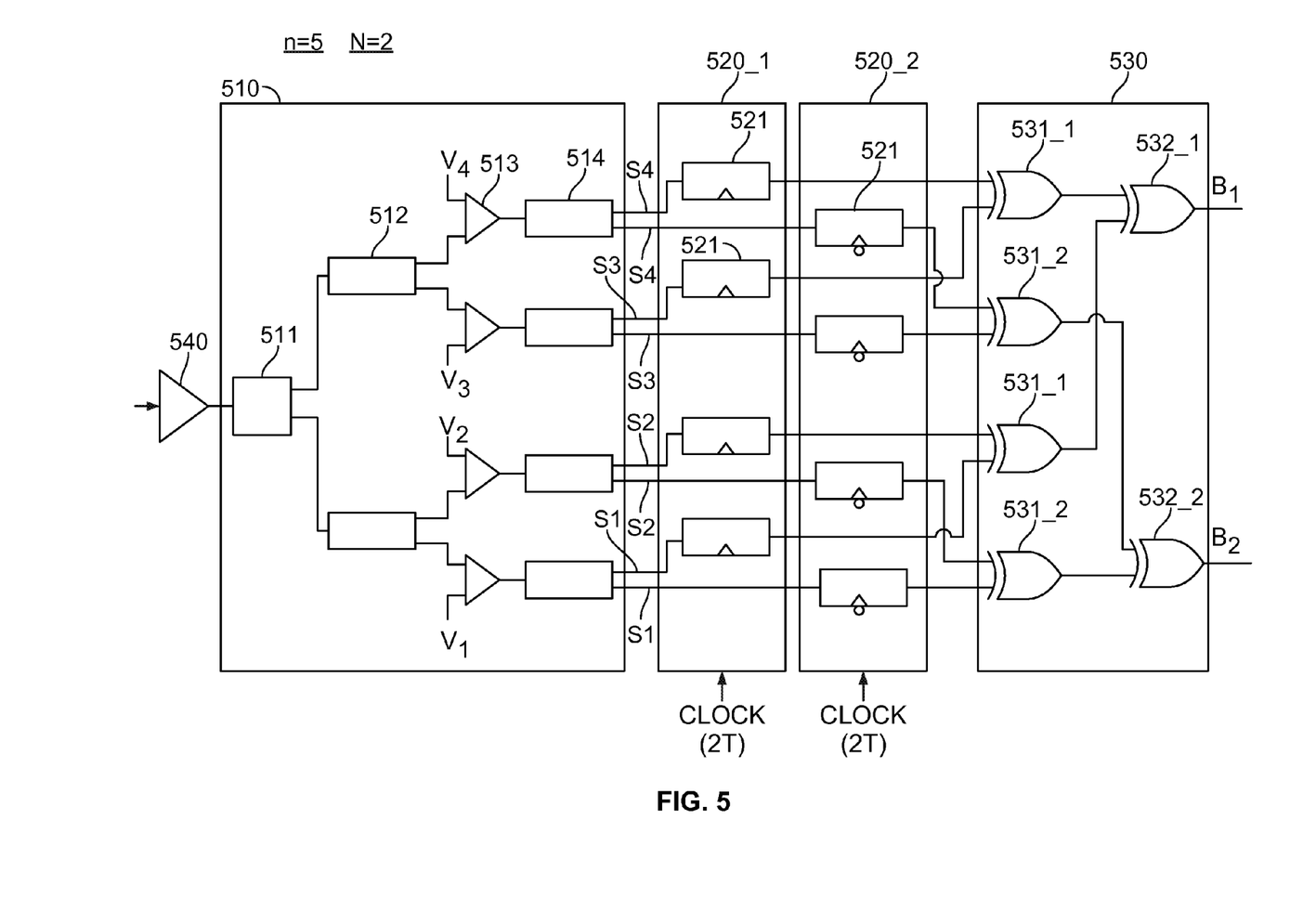
FIG. 5 is a schematic diagram of an example embodiment of circuitry of the disclosure where n=5 and N=2.

FIG. 5 illustrates an example embodiment for which n=5 and N=2, such that the multi-level signal is a five level signal and the frequency is reduced by a factor 2. The circuitry comprises comparing and splitting circuitry 510, two sets of four flip-flop circuits each 521_1, 521_2, and logic or logical circuitry 530 with six XOR circuits 531_1, 531_2, 532_2. The comparing and splitting circuitry 510 comprises a plurality of first splitters 511, 512 for splitting the five level signal S into two sets of two five level signals, and four comparators 513, so that four output signals are obtained. These four output signals are further split by splitters 514 to obtain two sets of four output signals S1, S2, S3, S4. The first and second output of each splitter 514 is connected to a flip-flop circuit 521 of a first and second set 520_1, 520_2. The first set of flip-flop circuits 521_1 is arranged for sampling and holding in accordance with a rising edge of clock signal CLK, and the second set of flip-flop circuits 521_2 is arranged for sampling and holding in accordance with a falling edge of the clock signal CLK.

The logical circuitry 530 comprises four first stage XOR circuits 531_1, 531_2, and two second stage XOR circuits 532_1, 532_2. The logical circuitry 530 is configured to generate two binary signals B1, B2. In this way the data in the five level signal S with frequency 1/T is converted into two binary signals B1, B2 with a frequency 1/(2*T).

Figure 6:
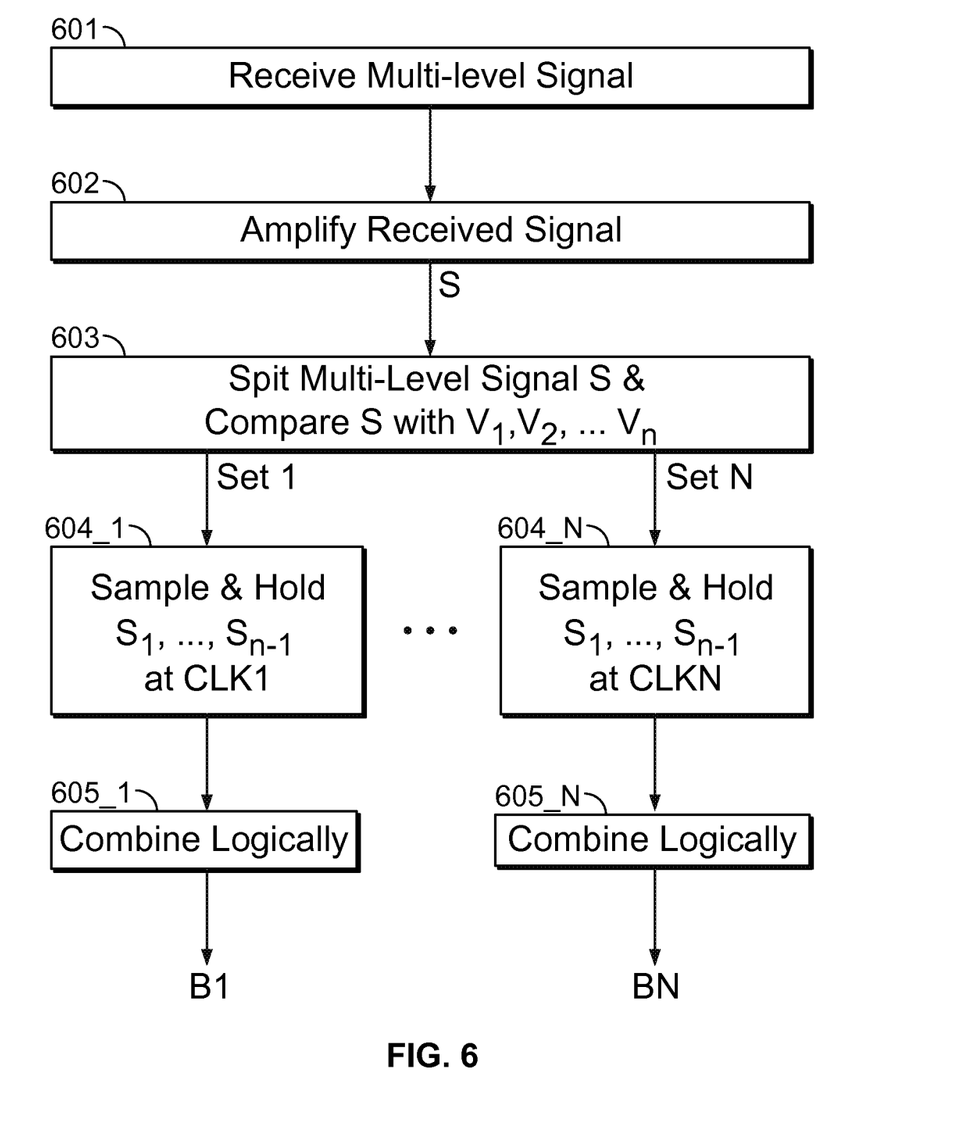
FIG. 6 is a flow chart illustrating an embodiment of the method of the disclosure.

FIG. 6 illustrates a flow chart of an example method for converting a multi-level signal into at least one binary signal, the multi-level signal having a period T and comprising n signal levels, n being equal to or greater than 3. In a first step 601 a multilevel signal is received. This step may comprise receiving an optical signal and converting the optical signal into a multilevel signal. In a second step 602 the received or converted signal is amplified to obtain a multi-level signal S. In a third step 603 a value of the multi-level signal S is compared with (n−1) different reference values $V_1, V_2, \ldots V_n$, and N sets of (n−1) output signals S1, ... Sn−1 are output or provided. Each set of (n−1) output signals indicate whether the value of the multi-level signal S is below or above the (n−1) reference values, wherein N is greater than or equal to 2.

Step 603 may comprise splitting the multi-level signal in (n−1) multilevel signals; comparing the (n−1) multilevel signals with the (n−1) reference values $V_1, V_2, \ldots V_n$; outputting (n−1) comparator output signals; and splitting the comparator output signals so that N sets of (n−1) comparator output signals S1, ... Sn−1 (SET1, ... SETN) are obtained.

In steps 604_1 to 604_N each set of (n−1) output signals S1, ... Sn−1 (SET1, ... SETN) is sent to a corresponding set of (n−1) sample-and-hold circuits. In one example embodiment, each set of the N sets of sample-and-hold circuits operates at a clock period N*T and samples-and-holds at moments in time which are shifted in time with respect to another set of the N sets. In the illustrated embodiment the first set uses a clock CLK1 which may be similar to CLOCK 1 in FIG. 1, and set N may use a clock CLKN which may be similar to CLOCK N in FIG. 1. In steps 605_1 to 605_N N, binary signals B1, ... BN having a period N*T are generated using the signals output by the N sets of (n−1) sample-and-hold circuits.

It will be clear to a person skilled in art that the implementation is suitable not only to electrical but also to optical signal receivers. In the latter case the multilevel signal is conveyed in phase rather than amplitude of the signal. Therefore, the use of a coherent optical receiver augmented by a local carrier is envisaged. This results in linear optical signal detection with three intensity levels after the receiver photodiode suitable for reception using the circuitry or method of embodiments of the disclosure.

As illustrated and discussed above, embodiments of the disclosure cover both duobinary partial response techniques as well as polybinary modulation techniques. The receiver architecture revealed in example embodiments enables the use of high speed duobinary modulation in electrical or optical interconnects thereby allowing the use of higher serial rates. Conventional solutions require higher bandwidth receiver circuits to be built in much faster silicon technology, leading to very high per unit costs. The proposed embodiments can achieve the same serial rates with more common silicon technologies.

Embodiments of circuitry disclosed herein may be used in interconnect systems employing non-standard-compliant high speed modulation using multilevel modulation.

The functions of the various elements shown in the figures, including any functional blocks labelled as "circuitry" or "modules", for example, may be provided through the use of dedicated hardware as well as hardware capable of executing software in association with appropriate software.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Whilst the principles of the disclosure have been set out above in connection with specific embodiments, it is to be understood that this description is merely made by way of example and not as a limitation of the scope of protection which is determined by the appended claims.

The invention claimed is:

1. Circuitry for converting a multi-level signal into at least one binary signal, the multi-level signal having a period T and comprising n signal levels, n being equal to or greater than 3, comprising:
    comparing and splitting circuitry configured for comparing a value of the multi-level signal with (n−1) different reference values, and having N sets of (n−1) output terminals for outputting N sets of (n−1) output signals, each set of (n−1) output signals indicating whether the value of the multi-level signal is below or above the (n−1) reference values, wherein N is greater than or equal to 2;
    N sets of (n−1) sample-and-hold circuits having an input and an output and being configured for operating at a clock period N*T, each set of the N sets being arranged for sampling-and-holding at moments in time that are shifted in time with respect to another set of the N sets, wherein each output terminal of a set of the N sets of (n−1) output terminals is connected to the input of a sample-and-hold circuit of a corresponding set of the N sets of (n−1) sample-and-hold circuits; and
    logical circuitry connected to the outputs of the N sets of (n−1) sample-and-hold circuits for generating at least one binary signal having a period N*T, using the signals on the outputs of the N sets of (n−1) sample-and-hold circuits.

2. The circuitry of claim 1, wherein each set of the N sets of (n−1) sample-and-hold circuits is arranged for sampling-and-holding at moments in time that are shifted over the period T with respect to another set of the N sets.

3. The circuitry of claim 2, wherein the comparing and splitting circuitry further comprises:
    at least one first splitter for splitting the multi-level signal in (n−1) multilevel signals;
    (n−1) comparators, each comparator having an input connected for receiving a multi-level signal of the (n−1) multilevel signals, and an output, wherein each comparator is configured with a different reference value of the (n−1) reference values; and
    at least (n−1) second splitters,
    wherein the output of each comparator is connected through at least one second splitter of the at least (n−1) second splitters to a sample-and-hold circuit of each set of the N sets of (n−1) sample-and-hold circuits.

4. The circuitry of claim 2, wherein n is 3 so that the multilevel signal is a duobinary signal, and N is 4, wherein the comparing and splitting circuitry further comprises:
    at least one first splitter for splitting the duobinary signal in two duobinary signals;
    two comparators, each comparator having an input connected for receiving a duobinary signal of the two duobinary signals, and an output, wherein each comparator is configured with a different reference value of the (n−1) reference values;
    two second splitters; and
    four third splitters,
    wherein the output of each comparator is connected through a second splitter of the two second splitters and a third splitter of the four third splitters to a sample-and-hold circuit of each set of the four sets of two sample-and-hold circuits.

5. The circuitry of claim 1, wherein the logical circuitry comprises at least N XOR circuits.

6. The circuitry of claim 5, wherein a first XOR circuit of the at least N XOR circuits has a first input connected to the output of a first sample-and-hold circuit of a first set of the N sets of (n−1) sample-and-hold circuits and a second input connected to a second different sample-and-hold circuit of the first set, and wherein a second XOR circuit of the at least N XOR circuits has a first input connected to the output of a first sample-and-hold circuit of a second set of the N sets of (n−1) sample-and-hold circuits and a second input connected to a second different sample-and-hold circuit of the second set.

7. The circuitry of claim 1, wherein the logical circuitry comprises N*(n−2) XOR circuits.

8. The circuitry of claim 7, wherein each XOR circuit of the N*(n−2) XOR circuits has a first input connected to the output of a first sample-and-hold circuit of a first set of the N sets of (n−1) sample-and-hold circuits, and a second input connected to a second different sample-and-hold circuit of the first set.

9. The circuitry of claim 8, further comprising receiver circuitry configured for receiving an optical signal and for converting the optical signal into the multi-level signal.

10. The circuitry of claim 1, wherein the N sets of (n−1) sample-and-hold circuits are N sets of (n−1) flip-flop circuits.

11. A method for converting a multi-level signal into at least one binary signal, the multi-level signal having a period T and comprising n signal levels, n being equal to or greater than 3, comprising:

comparing a value of the multi-level signal with (n−1) different reference values, and outputting N sets of (n−1) output signals, each set of (n−1) output signals indicating whether the value of the multi-level signal is below or above the (n−1) reference values, wherein N is greater than or equal to 2;

operating N sets of (n−1) sample-and-hold circuits at a clock period N*T, each set of the N sets sampling-and-holding at moments in time that are shifted in time with respect to another set of the N sets, wherein each set of (n−1) output signals of the N sets of (n−1) output signals is sent to a corresponding set of the N sets of (n−1) sample-and-hold circuits; and generating at least one binary signal having a period N*T using signals output by the N sets of (n−1) sample-and-hold circuits.

12. The method of claim 11, wherein each set of the N sets of (n−1) sample-and-hold circuits is sampling-and-holding at moments in time that are shifted over the period T with respect to another set of the N sets.

13. The method of claim 12, wherein the comparing a value of the multi-level signal with (n−1) different reference values and the outputting N sets of (n−1) output signals comprises:

splitting the multi-level signal in (n−1) multilevel signals;

comparing the (n−1) multilevel signals with the (n−1) reference values and outputting (n−1) comparator output signals; and splitting the comparator output signals so that N sets of (n−1) comparator output signals are obtained.

14. The method of claim 12, further comprising receiving an optical signal and converting the received optical signal into the multi-level signal.

15. Circuitry for performing the method of claim 14.

* * * * *